United States Patent
Kaes et al.

(10) Patent No.: US 11,415,892 B2
(45) Date of Patent: Aug. 16, 2022

(54) METHOD FOR PRODUCING A REFLECTING OPTICAL ELEMENT OF A PROJECTION EXPOSURE APPARATUS AND REFLECTING OPTICAL ELEMENT FOR A PROJECTION EXPOSURE APPARATUS, PROJECTION LENS AND PROJECTION EXPOSURE APPARATUS

(71) Applicant: Carl Zeiss SMT GmbH, Oberkochen (DE)

(72) Inventors: Matthias Kaes, Aalen (DE); Steffen Bezold, Berlin (DE); Matthias Manger, Aalen (DE); Christoph Petri, Oberkochen (DE); Pavel Alexeev, Aalen (DE); Walter Pauls, Huettlingen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/147,293

(22) Filed: Jan. 12, 2021

(65) Prior Publication Data
US 2021/0157244 A1    May 27, 2021

Related U.S. Application Data (63) Continuation of application No. PCT/EP2019/068418, filed on Jul. 9, 2019.

(30) Foreign Application Priority Data

Jul. 12, 2018    (DE) .......................... 102018211596.6

(51) Int. Cl.
*G03F 7/20*    (2006.01)

(52) U.S. Cl.
CPC .......... *G03F 7/70075* (2013.01); *G03F 7/702* (2013.01); *G03F 7/70316* (2013.01); *G03F 7/70891* (2013.01); *G03F 7/70958* (2013.01)

(58) Field of Classification Search
CPC .. G03F 7/70075; G03F 7/702; G03F 7/70891; G03F 7/70958; G03F 7/70316;
(Continued)

(56) References Cited

U.S. PATENT DOCUMENTS

| 4,298,247 A | 11/1981 | Michelet et al. |
| 6,821,682 B1 | 11/2004 | Stearns et al. |

(Continued)

FOREIGN PATENT DOCUMENTS

| CN | 103858055 A | 6/2014 |
| DE | 10239859 B3 | 4/2004 |

(Continued)

OTHER PUBLICATIONS

Hau-Riege et al., "Repair of phase defects in extreme-ultraviolet lithography mask blankets", Journal of Applied Physics, American Institute of Physics, vol. 96, No. 11, Jan. 1, 2004, pp. 6812-6821.

(Continued)

*Primary Examiner* — Christina A Riddle
(74) *Attorney, Agent, or Firm* — Edell, Shapiro & Finnan, LLC (57) ABSTRACT

A method for producing a reflecting optical element for a projection exposure apparatus (1). The element has a substrate (30) with a substrate surface (31), a protection layer (38) and a layer partial system (39) suitable for the EUV wavelength range. The method includes: (a) measuring the substrate surface (31), (b) irradiating the substrate (30) with electrons (36), and (c) tempering the substrate (30). Furthermore, an associated reflective optical element for the EUV wavelength range, a projection lens with a mirror (18, 19, (Continued)

20) as reflective optical element, and a projection exposure apparatus (1) including such a projection lens.

9 Claims, 3 Drawing Sheets

(58) Field of Classification Search
CPC ............... G03F 7/70883; G03F 7/7015; G03F 7/70191; G03F 7/70233; G03F 7/70258; G03F 7/70308; G03F 7/70425; G03F 7/70483–70541; G03F 7/7055–706; G03F 7/7085; G03F 7/7095; G03F 7/70966; G03F 7/70983; G03F 7/70975; G02B 1/14; G02B 5/0891; G21K 1/062; C03C 23/00–007
USPC ...................... 355/18, 30, 52–55, 67–71, 77; 65/377–384, 394, 425, 441, 11–115
See application file for complete search history.

(56) References Cited

U.S. PATENT DOCUMENTS

| | | | |
|---|---|---|---|
| 6,844,272 | B2 | 1/2005 | Taylor et al. |
| 6,849,859 | B2 | 2/2005 | Folta et al. |
| 6,898,011 | B2 | 5/2005 | Kandaka et al. |
| 7,083,290 | B2 | 8/2006 | Masaki et al. |
| 7,189,655 | B2 | 3/2007 | Takaoka |
| 10,747,102 | B2 | 8/2020 | Jindal |
| 2001/0006412 | A1 | 7/2001 | Karl-Heinz et al. |
| 2003/0006214 | A1 | 1/2003 | Stearns et al. |
| 2003/0058986 | A1 | 3/2003 | Oshino et al. |
| 2003/0081722 | A1 | 5/2003 | Kandaka et al. |
| 2004/0006186 | A1 | 1/2004 | Jensen et al. |
| 2004/0041555 | A1 | 3/2004 | Dathe et al. |
| 2008/0149858 | A1* | 6/2008 | Weiser .................... G02B 1/12 250/492.21 |
| 2009/0286166 | A1* | 11/2009 | Sugiyama ........... C03C 17/3665 430/5 |
| 2011/0080569 | A1 | 4/2011 | Eva et al. |
| 2012/0327384 | A1* | 12/2012 | Clauss ................... G02B 7/181 355/67 |
| 2014/0307308 | A1* | 10/2014 | Weiss ............... B29D 11/00865 359/355 |
| 2015/0168674 | A1* | 6/2015 | Bittner ................. G02B 7/1815 355/67 |
| 2019/0018324 | A1* | 1/2019 | Pauls .................. G03F 7/70033 |

FOREIGN PATENT DOCUMENTS

| | | |
|---|---|---|
| DE | 102007051291 A1 | 4/2009 |
| DE | 102009055119 A1 | 8/2011 |
| DE | 102011084117 A1 | 4/2013 |
| EP | 1521155 A2 | 4/2005 |
| TW | 201812434 A | 4/2018 |
| WO | 2011020655 A1 | 2/2011 |

OTHER PUBLICATIONS

Hau-Riege et al., "Correction of figure errors on optical surfaces by laser-induced contraction of Mo/Si multilayers", Optics Letters, Optical Society of America, vol. 28, No. 6, Mar. 15, 2003, pp. 456-458.
International Search Report, PCT/EP2019/068418, dated Nov. 4, 2019, 3 pages.
German Office Action with English translation, Application No. 10218211596.6, dated Feb. 14, 2019, 9 pages.
English translation of TW Office Action, Application No. 108124737, dated Jul. 10, 2020, 4 pages.
English translation of TW Search Report, Application No. 108124737, dated May 6, 2020, 1 page.

* cited by examiner

METHOD FOR PRODUCING A REFLECTING OPTICAL ELEMENT OF A PROJECTION EXPOSURE APPARATUS AND REFLECTING OPTICAL ELEMENT FOR A PROJECTION EXPOSURE APPARATUS, PROJECTION LENS AND PROJECTION EXPOSURE APPARATUS

CROSS REFERENCE TO RELATED APPLICATIONS

This is a Continuation of International Application PCT/EP2019/068418, which has an international filing date of Jul. 9, 2019, and the disclosure of which is incorporated in its entirety into the present Continuation by reference. In addition, this Continuation claims foreign priority under 35 U.S.C. § 119(a)-(d) to German patent application 10 2018 211 596.6, filed Jul. 12, 2018, the contents of which are also incorporated in their entirety into the present Continuation by reference.

FIELD OF THE INVENTION

The invention relates to a method for producing a reflecting optical element of a projection exposure apparatus and a reflecting optical element for a projection exposure apparatus. Moreover, the invention relates to a microlithographic projection lens comprising such an element and to a microlithographic projection exposure apparatus comprising such a projection lens.

BACKGROUND

Microlithographic projection exposure apparatuses for the extreme ultraviolet (EUV) wavelength range of 5-20 nm require that the reflecting optical elements used for imaging of a mask into an image plane have a high accuracy in their surface form. Likewise, masks, as reflecting optical elements for the EUV wavelength range, should have a high accuracy in their surface form since exchanges thereof factor significantly into the operating costs of a projection exposure apparatus.

Methods for correcting the surface form of optical elements are known, in particular, from U.S. Pat. Nos. 6,844,272 B2, 6,849,859 B2, DE 102 39 859 A1, U.S. Pat. No. 6,821,682 B1, US 2004 0061868 A1, US 2003 0006214 A1, US 2003 00081722 A1, U.S. Pat. Nos. 6,898,011B2, 7,083,290 B2, 7,189,655 B2, US 2003 0058986 A1, DE 10 2007 051 291 A1, EP 1 521 155 A2 and U.S. Pat. No. 4,298,247.

Some of the correction methods listed in the specified documents are based on locally compacting the substrate material of optical elements by irradiation. As a result, a change in the surface form of the optical element is achieved in the vicinity of the irradiated regions. Other methods are based on direct surface ablation of the optical element. Yet others of the aforementioned methods exploit the thermal or electrical deformability of materials in order to impress spatially extended surface form changes onto the optical elements.

DE 10 2011084117 A1 and WO 2011/020655 A1 disclose methods for protecting the reflecting optical element from long-term compaction of the order of a few percent by volume or from aging of the substrate material on account of EUV radiation, in addition to correcting the surface form. To this end, the surface of the reflecting optical element is homogeneously compacted by radiation and/or coated with a protection layer. Both methods prevent the penetration of the EUV radiation into the substrate material. As a result, surface deformations stemming from compaction of the material by the EUV radiation, which are unacceptable in the long run, can be prevented.

The cause of compaction or aging of substrate materials, such as Zerodur® by Schott AG or ULE® by Corning Inc., which have a proportion of $SiO_2$ of more than 40% by volume, is assumed to be that a thermodynamic non-equilibrium state is 'frozen-in' at the high production temperatures of the substrate material, said non-equilibrium state merging into a thermodynamic ground state in the case of EUV irradiation. Fitting to this hypothesis, it is possible to produce coatings of $SiO_2$ which exhibit no such compaction, since these layers are produced at substantially lower temperatures than is the substrate material, in the event of an appropriately chosen coating method.

A disadvantage in all the aforementioned methods for the targeted local and homogeneous compaction of the material for the purposes of correcting the surface form of the substrate and for protection against long-term changes by compaction is that said methods do not take into account that the compaction recedes over time and the changes in the surface form caused thereby. It is assumed that this compaction receding, which is also referred to as decompaction below, is based on a relaxation of the defect states in the material produced by irradiation.

SUMMARY

It is an object of the present invention to provide a method and a reflecting optical element, which address the disadvantages of the prior art described above. A further object of the invention lies in specifying a projection lens and a projection exposure apparatus comprising an improved optical element.

These objects are achieved by a device as claimed herein. Advantageous developments and variants of the invention are also claimed and described.

One aspect of the invention involves a method for producing a reflecting optical element for a projection exposure apparatus comprising a substrate with a substrate surface, a protection layer and a layer partial system suited for the EUV wavelength range, which method comprises:
a) measuring the substrate surface,
b) irradiating the substrate with the aid of electrons, and
c) tempering the substrate.

By way of example, the reflecting optical element can be a mirror or a mask. The coating of the substrate may comprise at least one layer partial system optimized for the reflection of EUV radiation, i.e., radiation at a wavelength of 13 nm or 7 nm. This reflection layer may comprise a periodic sequence of at least one period of individual layers, wherein the period can comprise two individual layers with different refractive indices in the EUV wavelength range. However, aperiodic layers or coatings, which merely comprise one layer, are also possible.

Optionally, a protection layer can be applied between the substrate and the reflection layer. This protection layer prevents the material under it from being compacted further by the used EUV radiation, i.e., the radiation used in the apparatus for exposure purposes. Here, the layer arrangement of the protection layer may comprise at least a thickness of greater than 20 nm, in particular greater than 50 nm, such that the transmission of EUV radiation through the layer arrangement is less than 10%, in particular less than 2%. The layer partial system can comprise at least one layer, which is formed or synthesized as a compound from a material of the group of: nickel, carbon, boron carbide, cobalt, beryllium, silicon, silicon oxides. These materials firstly have a sufficiently high absorption coefficient for EUV radiation and secondly do not change under EUV radiation. The layer arrangement of the at least one protection layer partial system can consist also, for example, of a periodic sequence of at least two periods of individual layers, wherein the periods may comprise two individual layers made of different materials, and wherein the materials of the two individual layers forming the periods may be either nickel and silicon or cobalt and beryllium. Such a layer stack can suppress the crystal growth of the absorbing metals and consequently provide an overall lower roughness of the layers for the actual reflection coating than would be possible in the case of pure metal protection layers with a corresponding thickness.

The accurate surface form of the substrate is ascertained by measuring the substrate surface, said surface form usually having a deviation from the intended value. The difference between the measured surface form and the intended surface form of the substrate yields the deviation of the substrate surface to be corrected. As a result of the local irradiation of the substrate, the substrate compacts in a region between 1 μm and 100 μm, preferably between 1 μm and 30 μm, below the surface and contracts, leading to a deformation on the surface which can correct the substrate surface. The compaction is dependent on, in particular, the energy and the dose of the electrons used for irradiation purposes or on the dose received by the material. By way of example, the values for energy and dose of electrons may lie in a range from 5 keV to 80 keV and 0.1 J/mm$^2$ to 4000 J/mm$^2$, respectively.

The radiation can also be used to produce protection of the substrate against advancing compaction during the service life as a result of EUV radiation. As a result, the substrate surface can be irradiated in full by doses, which may lie in the region of up to 4000 J/mm$^2$. This leads to saturation of the compaction, i.e., a state in which the compaction of the substrate no longer increases, or only still increases to negligible extent, in the case of a further irradiation of the substrate. This compacted region forms a protection layer that protects the remaining substrate from compaction by EUV radiation.

The regions of the substrate material for correcting the surface form deviation and for protective compaction near the substrate surface can be separated from one another by resorting to the different penetration depths of electron beams. Here, the energy for the surface correction may be greater than that for producing the protection layer. As a rule, a dose of up to 2500 J/mm$^2$ is enough to undertake a sufficient surface form correction when carrying out an irradiation with electrons for the purposes of correcting the surface.

The final tempering step leads to partial receding of the compaction of the substrate material previously introduced in the method steps, i.e., to a decompaction. Decompaction is an effect which occurs over time when using the substrate in a projection exposure apparatus, such as an EUV projection exposure apparatus, for example, and which may therefore lead to a non-negligible change in the substrate surface. Tempering accelerates the decompaction process, as a result of which the remaining change by decompaction over the service life of the substrate can be advantageously reduced to a negligible value.

In an advantageous variant of the invention, the temperatures used when tempering the substrate may lie in a range between 22° C. and 400° C. The values may lie in the range from 22° C. to at most 60° C. in the case of tempering in an oven. If the compacted layer is tempered with a laser, the values can preferably lie between 150° C. and at most 400° C. In this case, it holds true that: As the temperature increases, the material can be decompacted more quickly, as a result of which the process times can advantageously be minimized.

The selection of the temperatures depends on the degree of compaction and the geometry of the substrate. The upper limit of the temperature used for tempering purposes is predetermined by the temperature at which the material used for the substrate changes irreversibly or loses its form. By way of example, the materials used for the substrate can be SiSic, Zerodur® by Schott AG or ULE® by Corning Inc. or quartz glass or any other type of glass.

In a further advantageous variant of the invention, the temperature can be maintained over a duration of 1 h to 1000 h when tempering the substrate.

The decompaction obtained during tempering depends on the employed temperature, the degree of compaction prior to tempering, the geometry of the substrate and the duration for which the temperature is held. What generally applies is that the duration of the tempering process is shorter in the case of a smaller change in the substrate surface, i.e., in the degree of compaction of the substrate prior to tempering, and vice versa.

In a further advantageous variant of the invention, the temperature can be varied over time when tempering the substrate.

The temperature can be varied over time in order, for example, to achieve maximum decompaction and/or a reduction in the holding time with the same decompaction.

In a further advantageous variant of the invention, the substrate can be heated in homogeneous fashion during tempering.

The homogeneous heating of the entire substrate for tempering purposes is advantageous in that the substrate is tempered very uniformly and, as result thereof, no additional stresses are introduced into the material during tempering as a result of temperature gradients. By way of example, the temperature required for tempering purposes can be introduced into the substrate by irradiation with a laser. The substrate can be heated in homogeneous fashion by way of a suitable adjustment of the energy and the penetration depth of the laser and/or by attaching a heatsink for influencing the heat flow in the material. Alternatively, the substrate may also be heated to a certain temperature in an oven, for example, and may be cooled again after a certain holding time, as is known from the tempering of workpieces made of metal. This process is advantageous in that it is known and in that use can be made of available installations. Moreover, the process is simple, which has a positive effect on the production costs.

In a further advantageous variant of the invention, the substrate can be heated locally during tempering.

Depending on the geometry of the substrate and the undertaken compactions for correcting the surface form of the substrate, it may be advantageous not to homogeneously heat the substrate but to achieve the temperature necessary for tempering the substrate by way of local heating of the substrate. Local heating can be achieved by radiation on the substrate surface, for example by a laser or a lamp. The wavelength of the radiation should preferably lie in a region in which the reflection coating has high transmission and the substrate has a high degree of absorption. An advantage of the local heating is that higher temperatures can be set at the compacted regions of the substrate. By way of example, during the final production of the substrate surface, the reflecting optical elements may already be assembled in a holder that may only be exposed to relatively low temperatures of up to no more than 60° C., for example. As a result of local heating and complementary measures for locally dissipating the heat, the temperature in the substrate may locally reach up to 400° C., for example, without the temperature-sensitive region of the reflecting optical element reaching its critical temperature. As a result, the holding times can advantageously be reduced and hence the production costs can be minimized.

In a further advantageous variant of the invention, the temperature can be introduced into the substrate by irradiation with a laser with a wavelength of 2.6 µm to 2.8 µm, in particular a wavelength of 2.755 µm.

The employed substrate material has a component of $SiO_2$ of 40% by volume, wherein the OH groups introduced in the $SiO_2$ network have a resonance at a wavelength of 2.755 µm. The absorption at this wavelength is particularly high as a result of the excitation of the resonance, as a result of which the temperature increase in the substrate is implemented more quickly and/or a higher temperature in the substrate can be reached than at other wavelengths.

In a further advantageous variant of the invention, the change in the substrate as a result of tempering can be taken into account during the irradiation of the substrate in method step b).

Trials have shown that the change in the substrate during the decompaction is largely homogeneous over the material and only a small negligible component of the change is inhomogeneous. The advantage of this effect is that, as result thereof, a very accurate prediction of the decompaction is possible with the aid of trials, suitable calculation models and FEM models of the substrate. Compaction of the material can likewise be predicted well, and so, advantageously, the decompaction by tempering can already be taken into account during the compaction of the substrate, for example by an allowance. Hence, a prediction of the geometry of the substrate surface after tempering is possible and implementable with the required accuracy.

The method described further above can also be applied to the correction of an already produced reflecting optical element. After measuring the substrate surface including the coatings already applied, the substrate can be irradiated with an energy of between 5 and 80 keV and doses of between 0.1 $J/mm^2$ and 2500 $J/mm^2$ in order to correct local deformations of the substrate surface. The tempering following the irradiation can be carried out in identical fashion to the method described further above. The prediction of the compaction and decompaction of the substrate by the radiation and the tempering is also likewise possible, as in the case of the production of the reflecting optical element. Consequently, the reduction in the correction of the substrate surface by decompaction during the irradiation, i.e., the compaction of the substrate, can be kept available in order to achieve an advantageous minimal deviation of the substrate surface from the intended value of the surface.

The invention further includes a reflecting optical element for the EUV wavelength range comprising a layer arrangement applied to the surface of a substrate, wherein the layer arrangement comprises at least one layer partial system. The substrate, in a surface region adjoining the layer arrangement up to a distance of 5 µm from the surface, has a mean density that is more than 0.1% by volume higher than the mean density of the substrate at a distance of 1 mm from the surface. Furthermore, the substrate has a variation in the density of more than 0.1% by volume, at least along an imagined area at a fixed distance of between 1 µm and 100 µm, preferably between 1 µm and 30 µm, from the surface. Here, the temporal variation of the density, which is more than 0.1% by volume higher than the mean density of the substrate at a distance of 1 mm from the surface, is less than 20% in the first 7 years after the production of the optical element.

The dimensional stability of the substrate has a direct influence on the substrate surface and hence on the imaging quality of the optical element. The deformations of the substrate surface as a result of heating of the reflecting optical element during operation can be compensated by cooling or suitable manipulators. The change in the substrate surface as a result of long-term effects, which may be caused, for example, by a change in the substrate over time as a result of decompaction, is likewise compensable via manipulators. However, the order of the changes in the substrate surface can lie in a range that may exceed the limited travel of the manipulators, in particular in combination with the deformations caused by heating during operation. As a result of the substrate with long-term stability, this component can advantageously be minimized to an acceptable value.

Furthermore, the invention includes a microlithographic projection lens comprising a mirror as a reflecting optical element according to the embodiment described further above and/or a mirror as a reflecting optical element, which was produced according to one of the methods described further above.

Microlithographic projection lenses are exposed to high loads by the used radiation, the wavelength of which is preferably 13.5 nm, and the radiation at other wavelengths, as a result of which said microlithographic projection lenses are heated during operation. By using one of the mirrors described further above, the change in the mirror surface over time as a result of decompaction of the material can be advantageously minimized.

Furthermore, the invention includes a microlithographic projection exposure apparatus comprising a projection lens according to the embodiment described further above.

Projection exposure apparatuses are operated round-the-clock and every fault has an effect on the performance of the projection exposure apparatus. Servicing times of the projection exposure apparatus can advantageously be reduced by the use of projection optical units with long-term stability.

BRIEF DESCRIPTION OF THE DRAWINGS

Illustrative embodiments and variants of the invention are explained in more detail below with reference to the drawing, in which.

DETAILED DESCRIPTION

Figure 1:
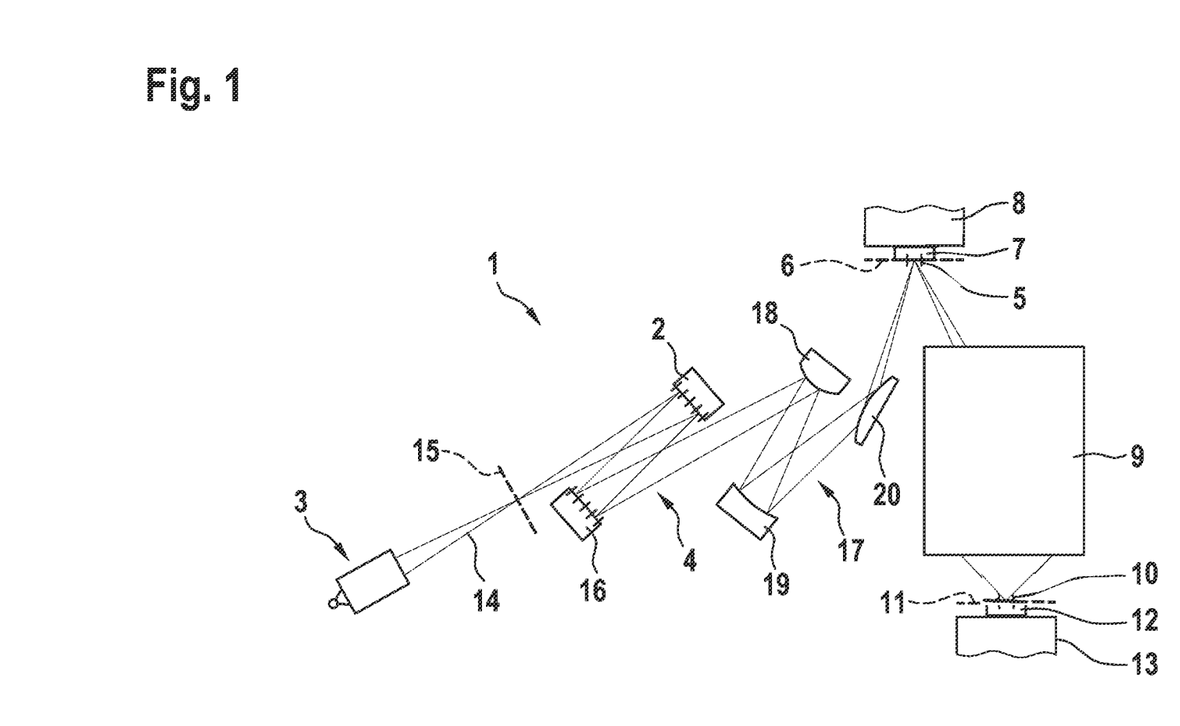
FIG. 1 shows the basic construction of an EUV projection exposure apparatus, in which the invention can be implemented.

FIG. 1 shows by way of example the basic construction of a microlithographic EUV projection exposure apparatus 1, in which the invention can find use. An illumination system of the projection exposure apparatus 1 comprises, besides a light source 3, an illumination optical unit 4 for the illumination of an object field 5 in an object plane 6. EUV radiation 14 in the form of optical used radiation generated by way of the light source 3 is aligned using a collector, which is integrated in the light source 3, in such a way that said radiation passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7, which is arranged in the object field 5 and held by a schematically illustrated reticle holder 8, is illuminated. A projection optical unit 9, illustrated merely schematically, serves for imaging the object field 5 into an image field 10 in an image plane 11. A structure on the reticle 7 is imaged onto a light-sensitive layer of a wafer 12, which is arranged in the region of the image field 10 in the image plane 11 and is held by a wafer holder 13 that is likewise illustrated in part. The light source 3 can emit used radiation in particular in a wavelength range of between 5 nm and 30 nm.

The invention may likewise be applied in a DUV apparatus, which is not illustrated. A DUV apparatus is set up in principle like the above-described EUV apparatus 1, wherein mirrors and lens elements can be used as optical elements in a DUV apparatus and the light source of a DUV apparatus emits used radiation in a wavelength range from 100 nm to 300 nm.

Figure 2A:
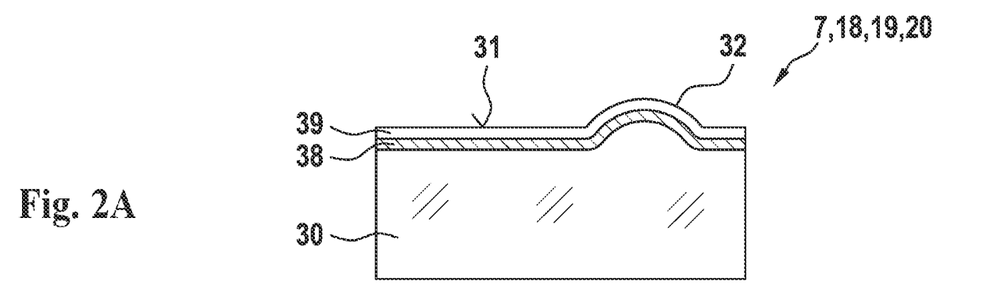
FIGS. 2A-2C show a schematic illustration of measuring (FIG. 2A), irradiating (FIG. 2B) and tempering (FIG. 2C) steps of a method according to the invention for producing an optical element according to the invention
Figure 2B:
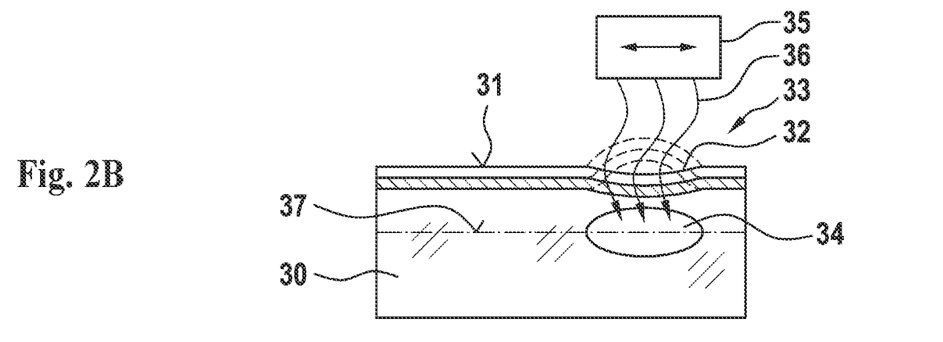
Figure 2C:
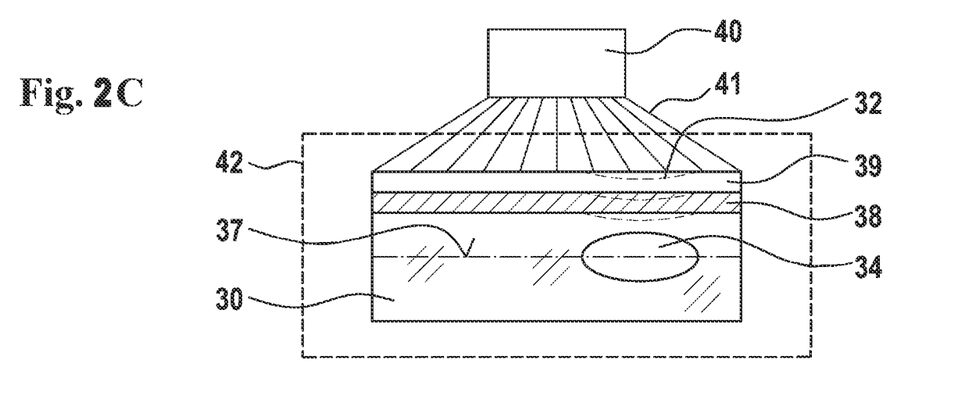

FIGS. 2A-2C schematically show respective method steps for producing a reflecting optical element according to the invention, such as, for example, a mirror 18, 19, 20 according to the invention or a reticle 7 according to the invention of FIG. 1. In method step a) (FIG. 2A), a mirror 18, 19, 20 or a reticle 7 is provided, which comprises a substrate 30 with a layer partial system 39, which is suitable for the reflection in the EUV wavelength range, and a protection layer 38. The layer partial system 39 may consist of a periodic sequence of at least one period of individual layers, wherein the period comprises two individual layers with different refractive indices in the EUV wavelength range. The layer partial system 39 may also consist of only one layer or comprise a layer system with an aperiodic sequence of layers. The protection layer 38 arranged under the reflection layer 39 should prevent the penetration of EUV radiation into the substrate 30. The surface form 31 of the mirror 18, 19, 20 or of the reticle 7 is measured with an interferometer. The measurement with the interferometer is not illustrated in FIGS. 2A-2C for reasons of clarity. In so doing, the mirror 18, 19, 20 or the reticle 7 is determined in method step a) to have an unwanted surface form deviation 32 from the desired intended surface form.

This surface form deviation 32 is corrected in method step b) (FIG. 2B) via irradiation 33 by way of the compaction of the substrate region 34 caused thereby. The radiation 33 is provided by electrons 36 of an electron beam source 35. What can be considered here, in particular, is electron irradiation 33 with electrons 36 with an energy of between 5 and 80 keV at doses of between 0.1 J/mm$^2$ and 2500 J/mm$^2$ and/or photon irradiation with the aid of a pulsed laser with wavelengths between 0.3 and 3 μm, repetition rates between 1 Hz and 100 MHz and pulse energies between 0.01 μJ and 10 mJ. As a result of the compaction of the substrate region 34, a variation in the density of the substrate material of more than 0.1% by volume results along an imagined area 37 at a fixed distance from the surface, said imagined area extending through the compacted substrate region 34. Here, variation of the density is understood to mean the difference between the maximum value of the density and the minimum value of the density along this imagined area 37 of constant distance. In the case of a homogeneous irradiation 33 of the substrate region 34, this prescription means that the substrate region 34 has a density that is higher than that of an adjacent non-irradiated region at the same distance from the surface by more than 0.1% by volume. The correction of the surface form is over-corrected in order to make allowances for effects in the further procedure and consequently obtain the desired surface form after the last method step c). Further details are described in relation to method step c) and with respect to FIGS. 3A-3C.

Finally, the substrate 30 is tempered in method step c) (FIG. 2C). Tempering is achieved by heating the substrate 30 to certain temperature and maintaining the temperature over a certain period of time. Heating of the substrate 30 can be implemented by laser light 41 of a laser source 40, which irradiates the substrate surface 31 in full or else only in part. As a result of tempering the substrate 30, compaction is partly undone again, i.e., the surface form deviation 32 changes in the opposite direction again in relation to the state immediately after method step b). As mentioned in relation to method step b), allowances for this decompaction can already be made during the compaction for correcting the substrate surface 31 such that the intended surface form is obtained by the last method step c) of tempering. As an alternative, the substrate 30 can also be heated in an oven 42, as is known from methods for tempering metals. In so doing, the substrate 30 is placed into the oven 42 with all attachments for the substrate already assembled in place. A predetermined temperature-time curve can then be set on the oven 42, said curve leading to the desired result of a surface form that corresponds to the intended surface form.

The reflecting optical element produced by method steps a) to c) of FIGS. 2A-2C can subsequently be used as an EUV mirror 18, 19, 20 or as an EUV reticle 7 in a projection exposure apparatus.

Figure 3A:
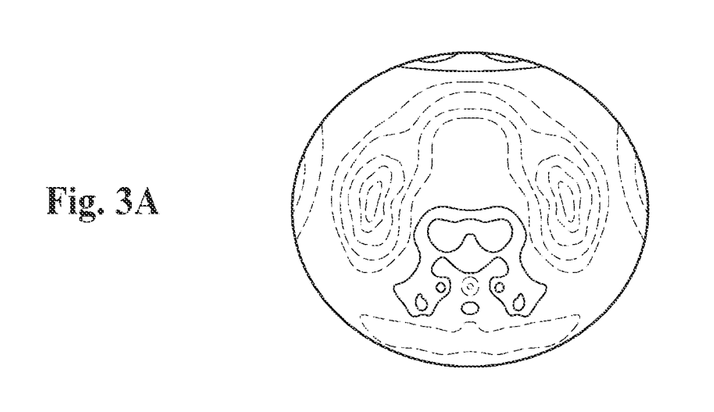
FIGS. 3A-3C show a schematic illustration of a surface form of an element according to the invention by way of the process, specifically before (FIG. 3A) and after (FIG. 3B) irradiation according to the invention, as well as an illustration (FIG. 3C) of a calculated difference between these surface forms.
Figure 3B:
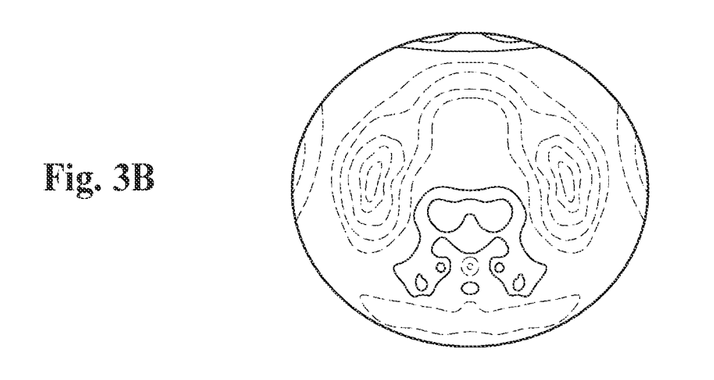
Figure 3C:
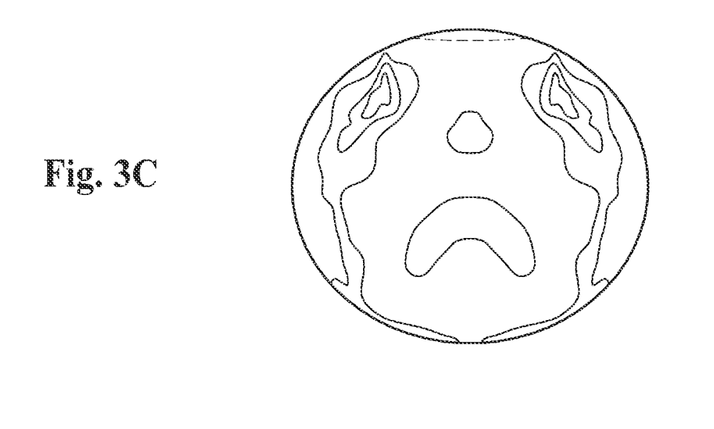

FIGS. 3A-3C illustrate schematic images, created with an interferometer measurement, of the substrate surface 31, or a difference, created by calculations, of two images of a substrate surface 31 created with interferometry measurements. The lines in FIGS. 3A-3C should be understood to be contour lines, with solid lines representing an elevation out of the plane of the drawing and the dashed lines representing a depression into the plane of the drawing.

Here, FIG. 3A shows the substrate surface 31 after a long irradiation duration of 4000 h, for example, by used EUV radiation. FIG. 3B shows the substrate surface 31 of the same substrate 30 after method step b). If the difference of the two measurements is formed by calculation, this comprises a homogeneous component and an inhomogeneous component. The homogeneous component of the difference is so much greater than the inhomogeneous component that the inhomogeneous component is not relevant to a possible prediction of the surface form after the method described further above. From this, a simple calculation rule is derived as follows:

surface form$_{c)}$=$KF$×surface form$_{b)}$+inhomogeneous difference, where surface form$_{c)}$ e denotes the final surface form of the substrate 30 obtained after method step c), i.e., tempering, KF denotes a factor depending on the substrate material, the geometry of the substrate 30 and the size of the surface correction, surface form$_{b)}$ denotes the surface form after method step b) and inhomogeneous difference denotes a poorly predictable residual error.

It is possible to create models about the behaviour of the material during compaction as a result of irradiation 33 and decompaction by tempering on the basis of trials, in which the substrate material 30 was treated by irradiation 33 as described further above in method step b) and subsequently treated by tempering according to method step c) described further above. With the assistance of FEM models, these models can be used to ascertain the factor KF. Here, the FEM models can convert the stresses arising through compaction into changes in the substrate surface 31 by taking account of the geometry of the substrate 30. Here, the decompaction arising in method step c) and the effect thereof on the surface form deviation 32 can already be allowed for in method step b). The method can be used to produce a reflecting optical element 7, 18, 19, 20 with a maximum long-term stability for use in an EUV projection exposure apparatus. Moreover, the method can also be used to correct reflecting optical elements, the production of which has already been completed.

LIST OF REFERENCE SIGNS

1 Projection exposure apparatus
2 Facet mirror
3 Light source
4 Illumination optical unit
5 Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
30 Substrate
31 Substrate surface
32 Surface form deviation
33 Irradiation
34 (Compacted) substrate region
35 Electron source
36 Electron (irradiation)
37 (Imagined) area
38 Protection layer
39 Reflection layer
40 Laser source
41 Laser light
42 Oven

What is claimed is:

1. Method for producing a reflecting optical element for a projection exposure apparatus, which comprises a substrate with a substrate surface, a protection layer and a layer partial system suited for an extreme ultraviolet (EUV) wavelength range, comprising:
    a) measuring the substrate surface,
    b) compacting the substrate by irradiating the substrate with electrons, and
    c) tempering the substrate after said compacting.

2. Method according to claim 1,
wherein said tempering comprises:
using tempering temperatures of between 22° C. and 400° C.

3. Method according to claim 1,
wherein said tempering comprises:
holding the tempering temperature over a duration of 1 h to 1000 h.

4. Method according to claim 1,
wherein said tempering comprises:
varying the tempering temperature over time.

5. Method according to claim 1,
wherein said tempering comprises:
heating the substrate homogeneously.

6. Method according to claim 1,
wherein said tempering comprises:
localized heating of the substrate.

7. Method for producing a reflecting optical element for a projection exposure apparatus, which comprises a substrate with a substrate surface, a protection layer and a layer partial system suited for an extreme ultraviolet (EUV) wavelength range, comprising:
    a) measuring the substrate surface,
    b) irradiating the substrate with electrons, and
    c) tempering the substrate,
    wherein said tempering comprises:
        introducing the tempering temperature into the substrate by irradiation with a laser with a wavelength of 2.6 µm to 2.8 µm.

8. Method according to claim 7,
wherein the wavelength is 2.755 µm.

9. Method for producing a reflecting optical element for a projection exposure apparatus, which comprises a substrate with a substrate surface, a protection layer and a layer partial system suited for an extreme ultraviolet (EUV) wavelength range, comprising:
    a) measuring the substrate surface,
    b) irradiating the substrate with electrons, and
    c) tempering the substrate,
    wherein said irradiating comprises:
        adjusting a set-point change in the substrate from said tempering in said irradiating of the substrate.

* * * * *

UNITED STATES PATENT AND TRADEMARK OFFICE
CERTIFICATE OF CORRECTION

PATENT NO. : 11,415,892 B2
APPLICATION NO. : 17/147293
DATED : August 16, 2022
INVENTOR(S) : Kaes et al.

It is certified that error appears in the above-identified patent and that said Letters Patent is hereby corrected as shown below:

In the Specification

Column 1, Line 47, delete "6,898,011B2," and insert -- 6,898,011 B2, --.

Column 1, Line 63, delete "aging" and insert -- ageing --.

Column 2, Line 5, delete "aging" and insert -- ageing --.

Column 8, Line 66, before "denotes" delete "e".

Signed and Sealed this
Twentieth Day of June, 2023

Katherine Kelly Vidal
*Director of the United States Patent and Trademark Office*